(12) United States Patent
Hodges

(10) Patent No.: US 7,598,146 B2
(45) Date of Patent: Oct. 6, 2009

(54) SELF-ALIGNED GATE AND METHOD

(75) Inventor: Robert Louis Hodges, Phoenix, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 97 days.

(21) Appl. No.: 11/469,361

(22) Filed: Aug. 31, 2006

(65) Prior Publication Data

US 2006/0292842 A1  Dec. 28, 2006

Related U.S. Application Data

(60) Division of application No. 10/827,409, filed on Apr. 19, 2004, now Pat. No. 7,126,190, which is a division of application No. 09/733,243, filed on Dec. 7, 2000, now Pat. No. 6,774,001, which is a continuation of application No. 09/170,957, filed on Oct. 13, 1998, now abandoned.

(51) Int. Cl.
  *H01L 21/4763* (2006.01)
(52) U.S. Cl. ............... 438/289; 438/270; 438/272; 438/290; 438/291; 438/305; 257/E21.432; 257/E21.434; 257/E21.437; 257/E21.443; 257/E29.055; 257/E29.063; 257/E29.122; 257/E29.266; 257/E29.278
(58) Field of Classification Search ........... 438/264, 438/289–306; 257/E21.432, E21.434, E21.437, 257/E21.443, E29.055, E29.059, E29.063, 257/E29.122, E29.266, E29.278
See application file for complete search history.

(56) References Cited

U.S. PATENT DOCUMENTS

| | | | |
|---|---|---|---|
| 4,378,627 A | 4/1983 | Jambotkar | |
| 4,419,810 A | 12/1983 | Riseman | |
| 4,758,528 A | 7/1988 | Goth et al. | |
| 5,027,185 A | 6/1991 | Liauh | |
| 5,171,700 A | 12/1992 | Zamanian | |
| 5,185,280 A | 2/1993 | Houston et al. | |
| 5,292,681 A | 3/1994 | Lee et al. | |

(Continued)

OTHER PUBLICATIONS

IBM Technical Disclosure Bulletin, vol. 28, #7, pp. 2767-2768, Dec. 1985.

(Continued)

*Primary Examiner*—Michael S Lebentritt
(74) *Attorney, Agent, or Firm*—Lisa K. Jorgenson; David V. Carlson

(57) ABSTRACT

A semiconductor structure comprises a silicon substrate of a first conductivity type including wells of a second conductivity type formed on a surface thereof. The wells may be laterally isolated by shallow trench isolation. Transistors are formed in the wells by first forming several chemically distinct layers. Anisotropic etching then forms openings in a top one of the layers. A blanket dielectric layer is formed in the openings and on the layers. Anisotropic etching removes portions of the blanket dielectric layer from planar surfaces of the substrate but not from sidewalls of the openings to form dielectric spacers separated by gaps within the openings. Gate oxides are formed by oxidation of exposed areas of the substrate. Ion implantation forms channels beneath the gate oxides. Polysilicon deposition followed by chemical-mechanical polishing defines gates in the gaps. The chemically distinct layers are then stripped without removing the dielectric spacers. Conventional fabrication operations define other structures to complete fabrication of an integrated circuit.

20 Claims, 3 Drawing Sheets

U.S. PATENT DOCUMENTS

| | | | |
|---|---|---|---|
| 5,322,809 A | | 6/1994 | Moslehi |
| 5,427,964 A | * | 6/1995 | Kaneshiro et al. ........... 438/231 |
| 5,434,093 A | | 7/1995 | Chau et al. |
| 5,449,937 A | * | 9/1995 | Arimura et al. ............. 257/345 |
| 5,492,847 A | | 2/1996 | Kao et al. |
| 5,597,752 A | | 1/1997 | Niwa |
| 5,637,516 A | | 6/1997 | Muller |
| 5,648,287 A | | 7/1997 | Tsai et al. |
| 5,675,166 A | | 10/1997 | Ilderem et al. |
| 5,688,700 A | | 11/1997 | Kao et al. |
| 5,744,841 A | | 4/1998 | Gilbert et al. |
| 5,793,088 A | | 8/1998 | Choi et al. |
| 5,796,157 A | | 8/1998 | Fallico et al. |
| 5,801,078 A | | 9/1998 | Jimenez |
| 5,872,030 A | | 2/1999 | Huang |
| 5,899,719 A | * | 5/1999 | Hong ......................... 438/289 |
| 5,936,278 A | | 8/1999 | Hu et al. |
| 5,937,293 A | | 8/1999 | Lee |
| 5,943,576 A | * | 8/1999 | Kapoor ....................... 438/302 |
| 6,020,227 A | | 2/2000 | Bulucea |
| 6,054,365 A | | 4/2000 | Lizotte |
| 6,190,980 B1 | | 2/2001 | Yu et al. |
| 6,201,278 B1 | | 3/2001 | Gardner et al. |
| 6,236,099 B1 | | 5/2001 | Boden, Jr. |
| 6,248,637 B1 | * | 6/2001 | Yu .............................. 438/300 |
| 6,271,565 B1 | | 8/2001 | Hook et al. |
| 6,475,852 B2 | * | 11/2002 | Wu et al. .................... 438/220 |
| 6,544,851 B2 | * | 4/2003 | Ponomarev et al. ......... 438/289 |
| 6,673,663 B2 | * | 1/2004 | Wu et al. .................... 438/217 |
| 6,774,001 B2 | * | 8/2004 | Hodges ...................... 438/301 |
| 7,081,392 B2 | * | 7/2006 | Enders et al. ............... 438/289 |
| 7,126,190 B2 | * | 10/2006 | Hodges ...................... 257/336 |
| 2007/0138523 A1 | * | 6/2007 | Popp et al. .................. 257/296 |

OTHER PUBLICATIONS

IBM Technical Disclosure Bulletin, vol. 31, #7, pp. 311-312, Dec. 1988.

Wolf et al., "Silicon Processing for the VLSI," vol. 1, pp. 191-194, 1986.

* cited by examiner

US 7,598,146 B2

SELF-ALIGNED GATE AND METHOD

BACKGROUND OF THE INVENTION

1. Field of the Invention

The present invention relates generally to semiconductor integrated circuit processing, and more specifically to an improved method for forming features having critical dimensions, such as transistor gates in an integrated circuit.

2. Description of the Related Art

Semiconductor manufacturing is capital intensive and extremely competitive. Survival of semiconductor manufacturing concerns depends on constant innovation to produce more components at lower costs. New device designs often require additional capital investment in order to fabricate the new designs, as is explained below in more detail.

The manufacturing cost of an integrated circuit depends in part on how much semiconductor area is required to implement desired functions. The area, in turn, is defined by geometries and sizes of elements of active components such as FET gates and by diffused or implanted regions such as FET sources and drains and bipolar transistor emitters and bases.

The smallest features in many devices have a critical dimension that is often similar in size to the wavelengths of light used to photolithographically define the feature. As a result, further reduction of the size of the critical dimension may require new equipment, using either shorter light wavelengths or techniques not dependent on light for feature definition (e.g., using focused electron beams). Capital costs of several tens of million dollars each are not unusual for these types of equipment.

Maximum operating frequency is a figure of merit for integrated circuits and is determined by a confluence of factors. Parasitic capacitance in transistors making up the integrated circuits strongly affects maximum operating frequency. Higher operating frequencies also tend to require smaller feature sizes for a variety of reasons. As a result, design techniques that reduce parasitic capacitance or that result in smaller feature sizes can be extremely valuable to semiconductor manufacturers.

SUMMARY OF THE INVENTION

The present invention is directed toward methods of making transistors on integrated circuits and transistors and integrated circuits made using such methods. One method includes forming one or more layers, which may be dielectric layers, on a surface of a semiconductor substrate that includes planar isolation structures that were previously formed on the surface of the semiconductor wafer. Openings having a first width are formed through a top one of the series of layers and a blanket dielectric layer having a predetermined thickness is formed in the openings and on the series of layers. An anisotropic etch removes the blanket dielectric layer from the series of layers and from bottoms of the openings but not from sidewalls of the openings, thereby forming dielectric spacers. As a result, a gap between the dielectric spacers has a second width that is equal to the first width minus twice the thickness of the blanket dielectric layer.

A first ion implantation through the gaps defines channels for transistors. In one aspect, the present invention employs an angled first ion implantation to provide a "halo" of implanted ions extending under at least one spacer at one edge of each of the gaps. In another aspect, the present invention employs a first ion implantation at normal or near normal incidence through the gaps. A gate material, which may include polycrystalline silicon, is formed in the gaps and on the series of layers. Chemical-mechanical polishing removes the gate material from the series of layers, leaving gate material forming a gate in each of the gaps. The series of layers that defined the openings are sequentially removed using one or more directional etching processes, leaving the dielectric spacers that were formed from the blanket dielectric layer on the sidewalls of the openings around the gates. A second ion implantation forms a source and a drain to either side of each gate. Conventional processing then completes FETs forming the integrated circuit through fabrication of self-aligned silicide contacts, pre-metal dielectric layers and metallized inter-level contacts.

As a result, a gate width is realized that is smaller than the first width of the opening by an amount that is equal to twice the thickness of the blanket dielectric layer. The implanted channel is self-aligned to the gate, reducing processing complexity. The source and drain implants are also self-aligned with respect to the gates and result in reduced capacitance, increasing operating frequency for the FETs.

DETAILED DESCRIPTION OF THE INVENTION

The embodiments of the present invention can be practiced in conjunction with conventional integrated circuit fabrication techniques, and therefore, only those process steps necessary for an understanding of the present invention are described. Furthermore, the figures representing cross-sections of portions of an integrated circuit during fabrication are not drawn to scale.

Figure 1:
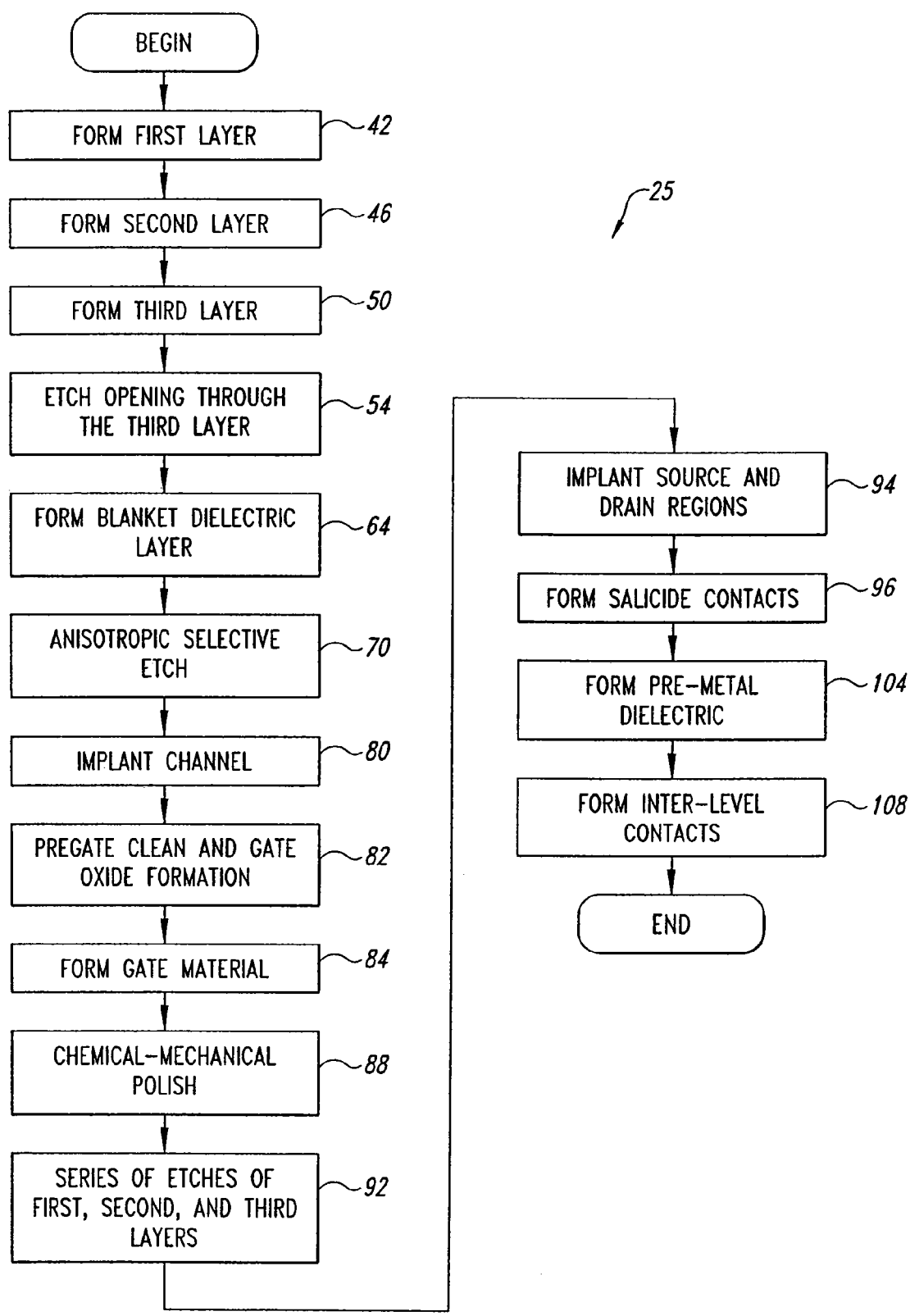
FIG. 1 is a flowchart of a process for making a semiconductor device, in accordance with embodiments of the present invention.
Figure 2:
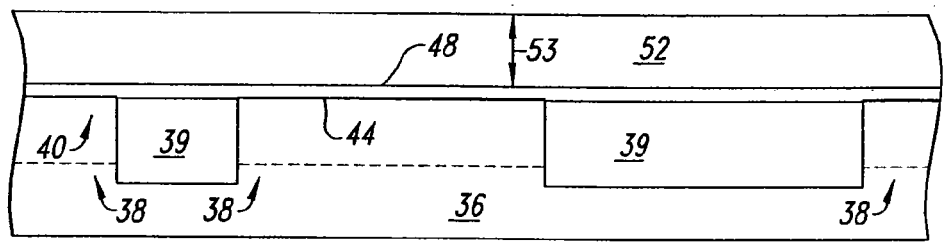
FIG. 2 is a side cross-sectional view of a portion of a semiconductor device partway through processing, in accordance with embodiments of the present invention.

Referring now to FIGS. 1 and 2, a first part of an embodiment of the present invention will now be described in detail. FIG. 1 is a flowchart of a process 25 for carrying out integrated circuit manufacturing, in accordance with embodiments of the present invention. A substrate 36 (FIG. 2) has previously been conventionally processed to provide isolation structures. The substrate 36 has a first type of conductivity that may be either n- or p-type conductivity, with the wells 38 having a second type of conductivity different than the first type of conductivity. In one embodiment, the substrate 36 is a n-type silicon substrate 36 and includes p-wells 38. In one embodiment, the substrate 36 also includes planar isolation structures, such as conventional shallow isolation trench structures 39 that include a dielectric formed in a trench in a surface 40 of the substrate 36.

Shallow isolation trench structures 39 provide coplanar surfaces 40, forming a benign environment for fine-line lithography. Additionally, shallow isolation trench structures 39 allow active devices to be packed more densely because the shallow isolation trench structures 39 do not need the separations between active devices that are required for other isolation techniques. Other processes that can provide isolation together with planar surfaces 40 include selective epitaxial growth and conventional silicon-on-insulator (SOI).

Selective epitaxial growth may be carried out by forming an oxide layer on the substrate 36 and then etching portions of the oxide layer off of the substrate 36. Epitaxy then results in islands of semiconductor material, such as silicon, in the areas where the portions of the oxide layer were removed. Conventional chemical-mechanical polishing then results in a planar surface 40 with isolated regions of epitaxially grown semiconductor material for active device fabrication.

In a step 42, an optional first layer 44 is formed on the surface 40 of the substrate 36. In one embodiment, the first layer 44 is formed as a thermal oxide layer grown on the surface 40 of the substrate 36. Thermal oxides are conventionally grown on silicon substrates 36 by heating the substrate 36 to a temperature on the order of 1,000° C. in an oxygen-bearing ambient. In one embodiment, the first layer 44 is formed to have a thickness of about two hundred Angstroms or less, although a greater thickness could be employed. The first layer 44 serves to protect the surface 40 from contamination.

In a step 46, a second layer 48 is formed on the first layer 44. The second layer 48 is formed from a material that is chemically different than the first layer 42. As a result, the second layer 48 may be etched by an etching process that does not etch the first layer 42. The shallow trench isolation structures 39 are protected from etching processes that could damage or affect them by chemical selectivity with respect to the second layer 48, i.e., etching processes for structures formed on the second layer 48 are chosen to not be able to etch the second layer 48, thereby shielding structures below the second layer 48 from these etching processes.

In one embodiment, the second layer 48 is formed from silicon nitride that may be deposited by conventional low-pressure chemical vapor deposition (LPCVD). However, plasma enhanced chemical vapor deposition (PECVD), chemical vapor deposition (CVD) or other conventional processes may be employed. The thickness of the second layer 48 is typically more than 5 Angstroms and thicknesses in a range of 200-500 Angstroms or less are desirable, although thicknesses of up to a thousand Angstroms or more may be practical.

In a step 50, a third layer 52 is formed on the second layer 48. The third layer 52 is formed from a material that is chemically different than the second layer 48. As a result, the third layer 52 may be etched by an etching process that does not etch the second layer 48. In one embodiment, the third layer 52 is a silicon dioxide layer formed by a PECVD process. In other embodiments, TEOS, LPCVD or atmospheric pressure CVD may be employed to form the third layer 52. The third layer 52 is formed to have a thickness 53 that is tailored to requirements imposed on thickness of a gate, as is described in more detail below. Typical thicknesses are in a range of several hundred to several thousand Angstroms. The steps 42, 46 and 50 result in the structure shown in FIG. 2.

Figure 3:
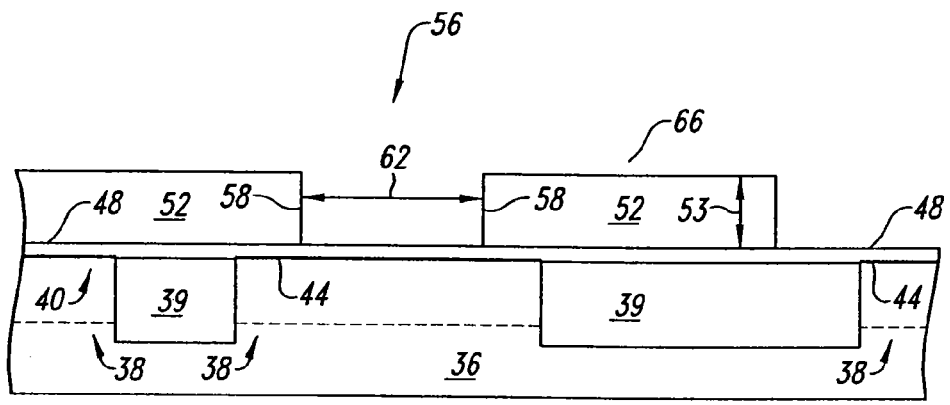
FIG. 3 is a side cross-sectional view of the portion of the semiconductor device further along in processing, according to embodiments of the present invention.

In a step 54, openings 56 (FIG. 3) are etched through the third layer 52 to the second layer 48. In one embodiment, the openings 56 are etched using an anisotropic reactive ion etching process that results in vertical or nearly vertical sidewalls 58 in the openings 56. The term "anisotropic etching" refers to an etching process that etches much more rapidly in a direction normal to the surface 40 than in other directions.

Additionally, in one embodiment, the second layer 48 is used as an etch stop in the step 54, i.e., the anisotropic etch is also selectively able to etch the third layer 52 but not the second layer 48. In one embodiment, the openings 56 are etched through openings in photoresist (not shown) that are defined photolithographically using deep ultraviolet exposure techniques, although X-ray or electron beam exposure techniques are also possible. In one embodiment, the openings 56 have a first width 62 on the order of 200 nanometers. In one embodiment, the thickness 53 of the third layer 52 is between 100 and 500 nanometers.

Figure 4:
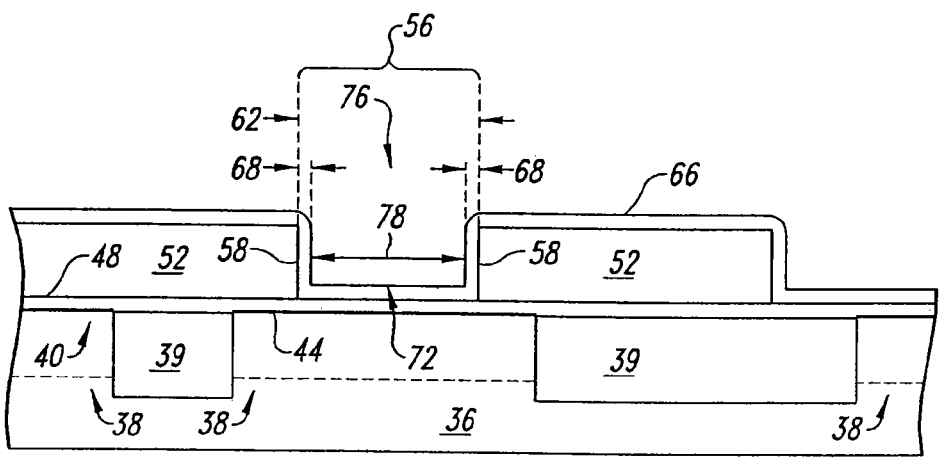
FIG. 4 is a side cross-sectional view of the portion of the semiconductor device further along in processing, according to embodiments of the present invention.

In a step 64, a blanket dielectric layer 66 (FIG. 4) having a predetermined thickness 68 is formed in the openings 56 and on the third layer 52. In one embodiment, the blanket dielectric layer 66 is a silicon nitride layer formed as described above with respect to the step 46. As a result, portions of both the second layer 48 and the blanket dielectric layer 66 may be etched during the same etching step, without etching the first layer 44 or the shallow trench isolation structures 39. In one embodiment, the blanket dielectric layer 66 is a silicon nitride layer providing thicknesses 68 of 50 nanometers on the sidewalls 58 of the openings 56. The blanket dielectric layer 66 may be formed by any process that provides good step coverage, such as LPCVD, and that results in a blanket dielectric layer 66 that does not react with metals used in forming self-aligned silicide contacts.

Figure 5:
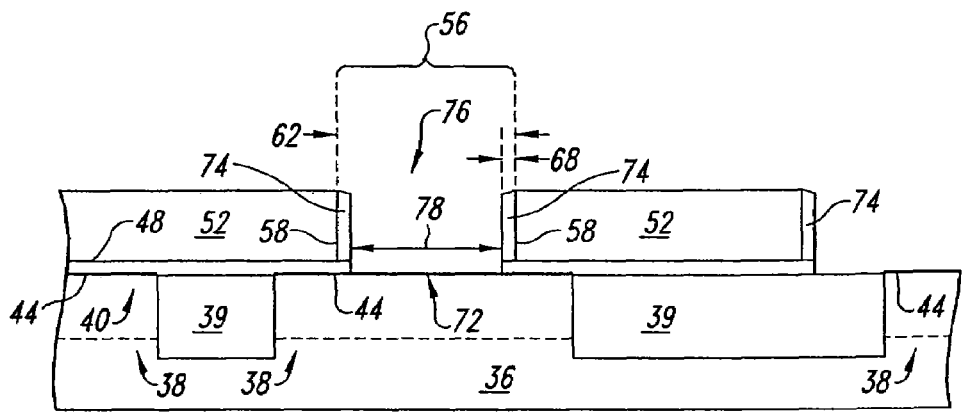
FIG. 5 is a side cross-sectional view of the portion of the semiconductor device further along in processing, according to embodiments of the present invention.

In a step 70, the blanket dielectric layer 66 is anisotropically etched from bottoms 72 of the openings 56 and from the third layer 52 but not from the sidewalls 58 to form dielectric spacers 74 (FIG. 5). A gap 76 between the dielectric spacers 74 thus has a second width 78 that is equal to the first width 62 minus twice the thickness 68. In one embodiment, the second width 78 is about 100 nanometers. In one embodiment, in the step 70, the first layer 44 is used as an etch stop, i.e., the anisotropic etch chosen to etch the second layer 48 and the blanket dielectric layer 66 cannot etch the first layer 44 or the third layer 52.

Figure 6:
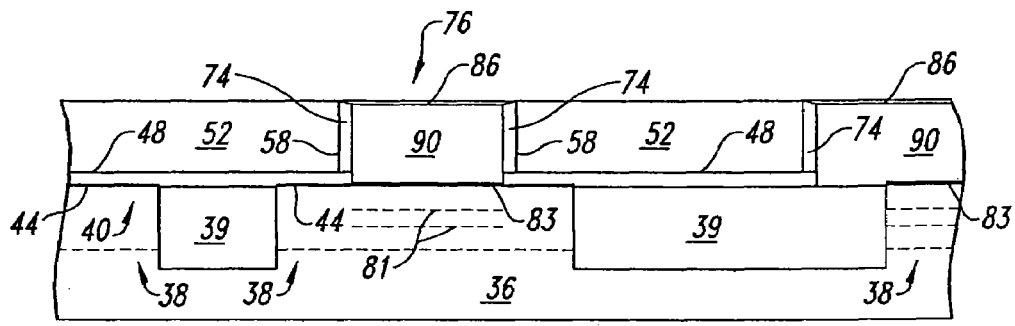
FIG. 6 is a side cross-sectional view of the portion of the semiconductor device further along in processing, according to embodiments of the present invention.

In a step 80, ion implantation and annealing forms a self-aligned channel 81 (FIG. 6) in the substrate 36 beneath the gap 76. In one embodiment, the self-aligned channel 81 is formed by implanting at multiple angles to provide "halos" or "pockets" of implanted ions under the dielectric spacers 74 on each side of the openings 56 but not in the gaps 76 between the dielectric spacers 74 within the openings 56. In another embodiment, the step 80 includes ion implantation at normal or near-normal incidence to provide the self-aligned channel 81. In one embodiment, the step 80 also includes implantation forming the wells 38. Following implantation, the implanted ions are activated by conventional annealing, which may be carried out using rapid thermal annealing or oven baking.

In a step 82, a pre-gate cleaning including etching of the first layer 44 is carried out and a gate oxide 83 is grown in the gaps 76. In a step 84, a gate material 86, which may include polycrystalline silicon, is formed in the openings 56 and on the third layer 52. In a step 88, conventional chemical-mechanical polishing removes the gate material 86 from the third layer 52, forming gates 90 in the gaps 76. The gates 90 thus have the second width 78, i.e., a critical dimension which is smaller than the dimension of any conventionally defined feature on the substrate 36. The openings 56 created in the step 54, together with the dielectric spacers 74 created in the steps 64 and 70, correspond to inverse or negative images that become the gates 90 in the step 88. The second width 78 of the gaps 76 thus defines the critical dimension. It will be appreciated that the gates 90 have a dimension transverse to the page of the illustrations that is much larger than the second width 78.

In a step 92, the first 44, second 48 and third 52 dielectric layers, but not the dielectric spacers 74, are sequentially removed using a series of etching processes, leaving the dielectric spacers 74 that were formed on the sidewalls 58 of the openings 56 around the gates 90. In one embodiment, the etching process used to remove the second layer 48 in the step 92 is an anisotropic etching process.

Figure 7:
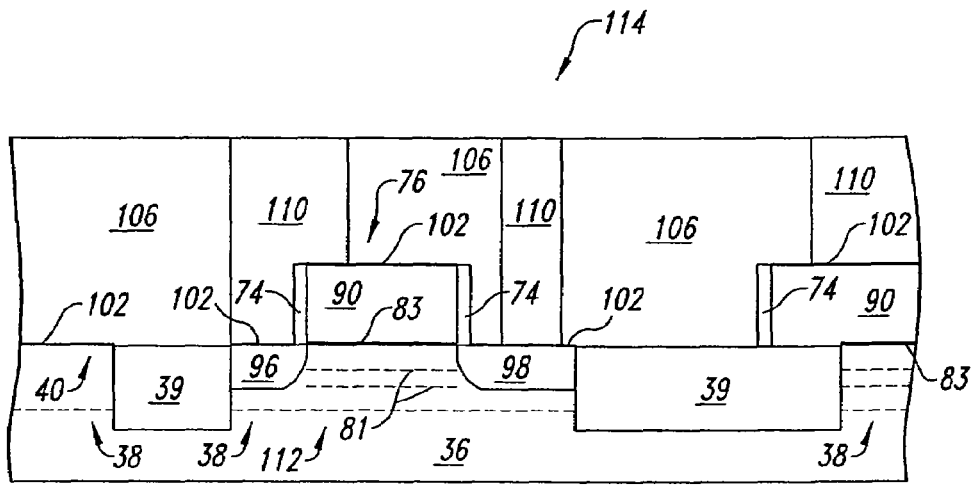
FIG. 7 is a side cross-sectional view of the portion of the semiconductor device further along in processing, according to embodiments of the present invention.

In a step 94, a second ion implantation and annealing forms source 96 (FIG. 7) and drain 98 regions to either side of the gates 90. The annealing is described above with respect to the step 80. The annealing of the implants of the steps 80 and 94 may be carried out separately in one embodiment or may be combined into a single annealing process following the ion implantation of the steps 80 and 94 in another embodiment. In a step 96, conventional self-aligned metal silicide contacts 102, also known as "salicide" contacts 102, are formed.

In one embodiment, the self-aligned silicide contacts 102 are formed by deposition of a metal such as cobalt or titanium that is then reacted with silicon, e.g., by rapid thermal annealing, to form metal silicide contacts 102 at top surfaces of the gates 90 and the source 96 and drain 98 regions, but the deposited metal does not react with the material forming the dielectric spacers 74. The metal on the dielectric spacers 74 then may be removed using an etching process that does not attack the self-aligned silicide contacts 102, leaving the self-aligned silicide contacts 102.

In a step 104, conventional fabrication processes provide and pattern pre-metal dielectric layers 106. In a step 108, conventional metallized inter-level contacts 110 are fabricated, using tungsten, copper or aluminum, for example. The process 25 then ends and conventional processing, packaging and testing operations are carried out to provide completed FETs 112 and integrated circuits 114 using the FETs 112.

The process 25 results in self-aligned gate 90, source 96 and drain 98 regions having reduced capacitance in the FETs 112. Capacitance between source 96 and drain 98 regions and the substrate 36 is reduced, resulting in improved performance and in particular resulting in increased operating speed/frequency. In one embodiment, the gates 90 have the second width 78 that may be one-half of the first width 62 of the openings that were created using lithographic techniques, allowing lithographic tools to be used that were only intended to be able to provide critical dimensions the size of the first width 62. As a result, lithography tools are provided with a longer useful life, allowing deferral of investment in capital equipment while still providing reduction in effective gate length.

Also, FETs 112 are provided having reduced length for the gate 90 (the second width 78 corresponds to gate length) together with self-aligned implanted channels 81 and source 96 and drain 98 regions. As a result, the FETs 112 provide increased operating frequency due to both reduced capacitance and reduced gate length. The integrated circuits 114 including the FETs 112 resulting from the process 25 provide enhanced performance without requiring increased investment in capital resources.

An advantage to the process 25 of FIG. 1 is that the gate oxide 83 is formed after all of the steps 42-80. Gate oxides 83 for FETs 112 having gate lengths 78 of 100 nanometers are extremely thin, on the order of fifteen to thirty Angstroms, and are susceptible to damage from processing needed for forming other portions of the integrated circuit 114. The process 25 forms the gate oxide 83 in the step 82, immediately prior to deposition of the gate material 86 in the step 84. As a result, the gate oxide 83 is not exposed to deposition and subsequent removal of other layers or structures, avoiding potential contamination or damage that could occur during the processing for the other layers or structures.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A semiconductor structure formed by a method comprising:
   forming a first layer on a surface of a silicon substrate having a first thickness;
   forming an opening having a first width through the first layer;
   forming a blanket dielectric layer having a second thickness on the first layer and in the opening, the second thickness being less than the first thickness;
   removing the blanket dielectric layer from the first layer and bottom of the opening, but not from sidewalls of the opening, to form dielectric spacers on each side wall within the opening, the gap having a second width less than the first width;
   implanting ions into the substrate at a location beneath at least one of the dielectric spacers, the implanting being performed at an angle to provide implanted ions under the at least one dielectric spacer;
   depositing a gate electrode into the gap after implanting ions through the gap;
   removing the first layer and leaving the dielectric spacers on the substrate;
   forming source and drain regions in the substrate and adjacent to the gate electrode;
   forming a first contact coupled to a first one of the source and drain regions and positioned directly on a first portion of the gate electrode;
   forming a second contact coupled to a second one of the source and drain regions; and
   forming a dielectric layer positioned on a second portion of the gate electrode and defined on opposite sides by the first and second contacts.

2. The semiconductor structure of claim 1 wherein the implanting step includes implanting ions through the gap using a tilted ion beam to produce a halo of implanted ions under the dielectric spacers at the sides of the gap.

3. The semiconductor structure of claim 1, further comprising, prior to forming the gate electrode in the gap, implanting ions through the gap using a normally incident or nearly normally incident ion beam.

4. The semiconductor structure of claim 1 wherein forming the gate electrode comprises:
   pre-gate cleaning;
   forming a gate dielectric on a bottom of the gap;
   forming a second layer of conductive material on the first layer and on the gate dielectric; and
   chemical-mechanical polishing to remove the second layer of conductive material from the first layer but not from the bottom of the gap.

5. The semiconductor structure of claim 1, further comprising forming a self-aligned metal silicide contact to the gate and to the source and drain regions.

6. The semiconductor structure of claim 1, wherein the first layer is a series of chemically distinct layers formed by the method comprising:
  forming a layer of silicon nitride on the surface of the substrate; and
  depositing an oxide layer on the silicon nitride layer, the deposited oxide layer having a thickness in a range of between 100 and 500 nanometers.

7. The semiconductor structure of claim 1, wherein forming an opening through a top one of the series of chemically distinct layers includes reactive ion etching the top one of the series of chemically distinct layers using an anisotropic etch that does not etch a chemically distinct layer beneath the top one of the series of chemically distinct layers.

8. An integrated circuit including field effect transistors formed by a method comprising:
  forming a layer of silicon nitride on a substrate;
  depositing an oxide layer on the silicon nitride layer, the oxide layer having a first thickness;
  forming an opening having a first width through the oxide layer;
  forming a blanket dielectric layer having a second thickness on the oxide layer and in the openings, the second thickness being half or less of the first thickness;
  removing the blanket dielectric layer from the oxide layer and bottoms of the opening but not from sidewalls of the opening to form dielectric spacers on either side of a gap within the opening, the gap having a second width less than the first width;
  forming a gate in the gap;
  implanting ions into the substrate at a location beneath the opening, the implanting being performed at multiple angles to provide implanted ions under the dielectric spacers on each side of the opening;
  removing the oxide layer and the silicon nitride layer but not the dielectric spacers;
  forming source and drain regions in the substrate;
  forming a first contact coupled to a first one of the source and drain regions and positioned directly on a first portion of the gate;
  forming a second contact coupled to a second one of the source and drain regions; and
  forming a dielectric layer positioned on a second portion of the gate and defined on opposite sides by the first and second contacts.

9. The integrated circuit of claim 8, further comprising, implanting a well in the substrate wherein the step of implanting ions defines opposite sides of a channel formed in the well.

10. The integrated circuit of claim 8, further comprising, prior to forming the gate in the gap, implanting ions through the gap using a normally incident or nearly normally incident ion beam.

11. The integrated circuit of claim 8 wherein forming gates comprises:
  pre-gate cleaning;
  forming a gate dielectric on bottoms of the gap;
  forming a layer of conductive material on the oxide layer and on the gate dielectric; and
  chemical-mechanical polishing to remove the layer of conductive material from the oxide layer.

12. The integrated circuit of claim 8, further comprising forming self-aligned metal silicide contacts to the gate and to the source and drain regions.

13. The integrated circuit of claim 8, wherein forming an opening through the oxide layer includes reactive ion etching the oxide layer using an anisotropic etch that does not etch the silicon nitride layer beneath the oxide layer, where the opening has substantially vertical sidewalls.

14. A semiconductor structure, comprising:
  a semiconductor substrate;
  a gate dielectric positioned on the substrate;
  a gate electrode positioned on the gate dielectric;
  first and second dielectric spacers positioned on the substrate and defining opposite sides of the gate electrode;
  source and drain regions implanted in the substrate and adjacent to a channel region underlying the gate dielectric;
  a first contact coupled to a first one of the source and drain regions and positioned directly on a first portion of the gate electrode;
  a second contact coupled to a second one of the source and drain regions; and
  a dielectric layer positioned on a second portion of the gate electrode and being defined on opposite sides by the first and second contacts.

15. The semiconductor structure of claim 14, further comprising a well implanted in the substrate, the well having an opposite conductivity type with respect to the substrate.

16. The semiconductor structure of claim 15, further comprising dielectric isolation structures formed in the substrate on opposite sides of the well.

17. The semiconductor structure of claim 14, further comprising first and second halos implanted in the substrate and under the first and second dielectric spacers, respectively, the channel being defined in the substrate by the halos.

18. The semiconductor structure of claim 17 wherein the first and second halos are formed by ion implanting at plural angles through the opening prior to forming the gate electrode in the opening, the plural angles being sufficient to form the halos only under the dielectric spacers without extending directly under the opening.

19. The semiconductor structure of claim 14, wherein the dielectric spacers have a height that is more than twice a width of the spacers.

20. The semiconductor structure of claim 14, further comprising silicide contacts formed on the gate electrode, source, and drain, the silicide contacts formed on the gate electrode and the first one of the source and drain regions being positioned under the first contact and the silicide contact formed on the second one of the source and drain regions being positioned under the second contact.

* * * * *